United States Patent [19]

Catchpole

[11] 3,837,723

[45] Sept. 24, 1974

[54] METHOD FOR MAKING HYBRID RADIANT ENERGY SENSOR WITH SOLID STATE ELEMENT AND TRANSFER ENERGY-SENSITIVE, ELECTRON-EMISSIVE SURFACE

[75] Inventor: Clive E. Catchpole, Southfield, Mich.

[73] Assignee: Galileo Electro-Optics Corporation, Sturbridge, Mass.

[22] Filed: Nov. 3, 1971

[21] Appl. No.: 195,327

[52] U.S. Cl. .................................... 316/19, 316/30
[51] Int. Cl. ............................................ H01j 9/38
[58] Field of Search ............... 316/3, 4, 5, 6, 7, 8, 9, 316/10, 11, 12, 16, 17, 18, 19, 20, 27, 30; 313/94

[56] References Cited

UNITED STATES PATENTS

| | | | |
|---|---|---|---|
| 3,037,833 | 6/1962 | Balkwill et al. | 316/30 X |
| 3,630,587 | 12/1971 | Garber et al. | 316/12 |
| 3,630,590 | 12/1971 | Strubig et al. | 316/4 |

*Primary Examiner*—Richard J. Herbst
*Assistant Examiner*—J. W. Davie

[57] ABSTRACT

A method for making a hybrid radiant energy sensor with a vacuum enclosure, an energy-sensitive electron-emissive surface, and at least one internal solid state electron multiplying element, where the energy-sensitive electron-emissive surface is formed outside the vacuum enclosure and subsequently transferred in a vacuum atmosphere into the vacuum enclosure and sealed therein, eliminating exposure of said solid state electron multiplier element to the alkali metals used in forming the energy-sensitive electron-emissive surface.

6 Claims, 4 Drawing Figures

METHOD FOR MAKING HYBRID RADIANT ENERGY SENSOR WITH SOLID STATE ELEMENT AND TRANSFER ENERGY-SENSITIVE, ELECTRON-EMISSIVE SURFACE

BACKGROUND OF THE INVENTION

Hybrid photomultiplier tubes using internal solid state elements have been the subject of considerable investigation over the past several years. The hybrid photomultiplier tubes which are a combination of vacuum tube and solid state components have significant advantages over conventional photomultiplier tubes in many applications, such as pulse counting, laser communications, or other situations where high speed and/or high output currents are required. The term "hybrid" as used in this disclosure refers to a radiant energy sensor incorporating both an energy-sensitive electron-emissive surface and solid state elements in a vacuum enclosure. The primary advantages of the hybrid photomultiplier are fast rise times, high output current capabilities, and good first dynode statistics, which significantly reduces the noise generated within the photomultiplier tube.

A major problem in the fabrication of the hybrid photomultiplier tubes with solid state elements has been the contamination of the solid state element by the alkali metal vapors used in sensitizing the photo-sensitive surface. The alkali metal contamination degrades the performance characteristics of the solid state element and consequently degrades the total performance of the hybrid photomultiplier tube.

One known technique which overcomes this problem and is discussed in the literature is the EPIC (Externally Processed, Internal Cathode) technique in which the photomultiplier envelope and energy-sensitive electron-emissive (photocathode) substrate are sealed in a common processing chamber with a thin membrane or trap door dividing the chamber into two isolated compartments, one element in each compartment. After the photocathode has been formed in its isolated chamber, the membrane is ruptured and one element is mechanically brought to the other where the vacuum seal between the two elements is effected.

Although the EPIC process is a solution to the problem, it has several drawbacks: the processing chamber is expensive and has a very limited life; the costs of the component parts of the EPIC processed tube are relatively expensive because of the precision required for making the internal seal; and the processing is normally limited to one tube assembly per processing cycle, further increasing the cost of each assembly.

The disclosed method for making hybrid photomultiplier tubes not only eliminates alkali metal vapors from contaminating the solid state element but also significantly lowers the fabrication costs and improves the production yield.

SUMMARY OF THE INVENTION

This invention discloses a method for making hybrid photomultiplier tubes wherein the energy-sensitive, electron-emissive surface is formed outside of the vacuum enclosure, and subsequently transferred therein. The external forming of the energy-sensitive surface eliminates the requirement for introducing alkali metal vapors into the vacuum enclosure containing the solid state element, and thereby prevents contamination of the solid state element and the degradation of the hybrid photomultiplier performance.

DETAILED DESCRIPTION

Figures 1, 2:
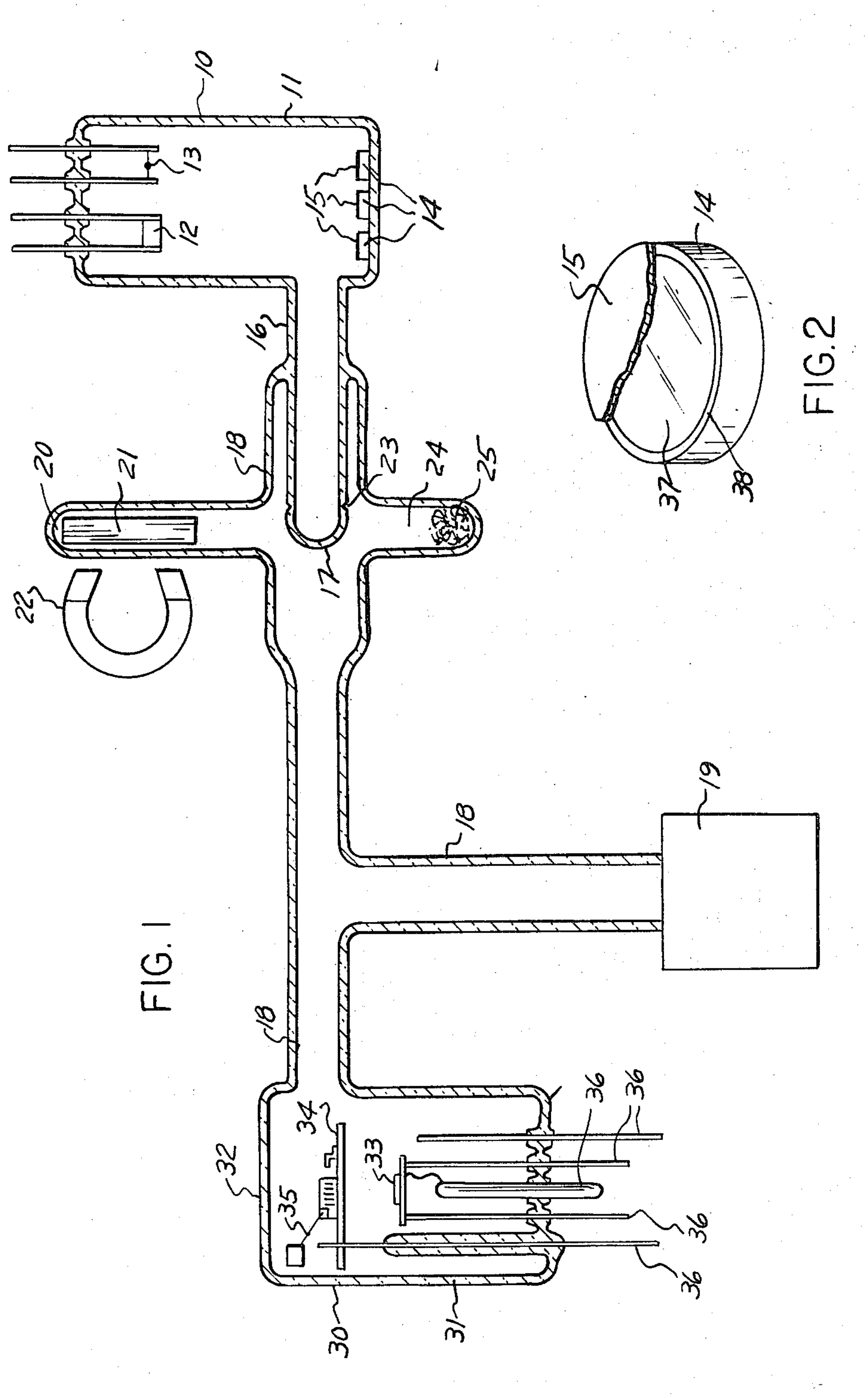
FIG. 1 is a cross-sectional view of the system showing principal components used in forming and transporting the energy-sensitive, electron-emissive surface into the hybrid radiant energy sensor.
FIG. 2 is an enlarged view of the transport substrate and its component parts.

The preferred embodiment of the method for transfering an energy-sensitive, electron-emissive surface from an isolated processing chamber to a hybrid radiant energy sensor with at least one solid state element is shown in FIG. 1. The primary elements of the system are the processing chamber 10, in which the energy-sensitive, electron-emissive surface is formed by reacting alkali metal vapors with other metals in a vacuum, the transportable substrates 14, the radiant energy sensor envelope 30, the vacuum pumping system 19, and the connecting tubulation 18. The processing chamber 10 in which the energy-sensitive, electron-emissive surface is formed consists of a vacuum enclosure 11 with alkali metal vapor generators 12 and metal evaporators 13. Located in the bottom of the vacuum enclosure 10 are a plurality of transportable substrates 14 on which the energy-sensitive electron-emissive surfaces 15 are formed. Extending from the vacuum envelope 10 is a glass transport arm 16, the inner section of said arm being sealed at end 17. The internal diameter of the transport arm 16 must be larger than the diameter of the transportable substrate 14, so that the transportable substrate 14 can be transported therethrough. The outer section of the transport arm extends beyond the sealed end 17 and is sealed to connecting tubulation 18 which connects the processing chamber 10 to the vacuum pump 19 and the radiant energy sensor envelope 30. Attached to the outer section of the transportation arm 18, directly above the sealed end 17, is the hammer chamber 20 containing a hammer 21. The hammer 21 is a metallic slug of sufficient weight to fracture the sealed end 17 when dropped from the top of the hammer chamber 20. The hammer 21 may be made from a magnetically susceptible metal so that it can be raised and dropped using an external magnet 22, as illustrated in FIG. 1. Other means of activating the hammer are equally suited to this application. In order to assure that the sealed end 17 will fracture in the desired location when the hammer 21 is dropped, a groove 23 is scratched around the glass tube where the fracture is desired. Below the hammer chamber 20 is the debris chamber 24 which holds the sealed end 17 and broken chips of glass after the hammer 21 is dropped. A wad of spun glass 25 is placed in the bottom of the debris chamber 24 to absorb the shock of the falling hammer 21 after fracturing the sealed end 17.

The radiant energy sensor envelope 30 consists of a vacuum enclosure 31, with a transparent window 32, a solid state element 33, a support plate 34, a latch 35, and leads 36 for the mechanical support of internal elements and electrical contact through the vacuum enclosure.

The details of the transportable substrate 14 are shown in FIG. 2. The transportable substrate 14 consists of a central transparent media 37 such as glass, ceramic, or other transparent crystalline substance physically attached to a surrounding magnetically susceptible band 38. This band can be constructed from a variety of magnetically susceptible materials such as iron, KOVAR, RHODAR, or any appropriate magnetically susceptible material having good vacuum characteristics and nondeleterious to the energy-sensitive, electron-emissive surface 15 formed on the surface of the transparent media 37 and magnetically susceptible band 38. In the alternative, when a transparent transportable substrate is not required, the transportable substrate may be made from a circular plate of magnetically susceptible material.

Figures 3, 4:
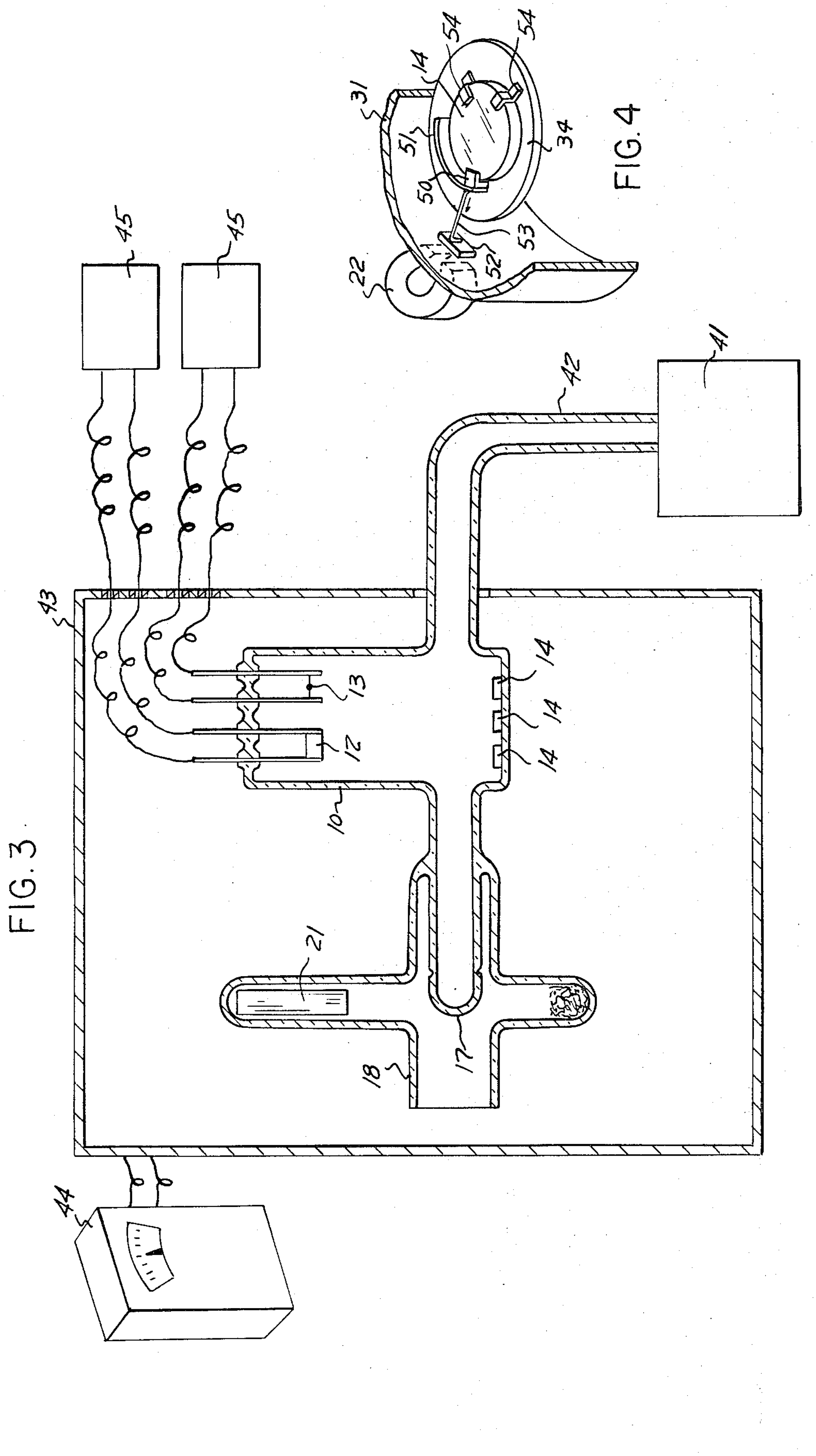
FIG. 3 is a cross-sectional view of the processing chamber and support equipment for forming the energy-sensitive, electron-emissive surfaces on the transport substrate.
FIG. 4 is an enlarged view of a typical latching mechanism for the transport substrate in the hybrid radiant energy sensor.

The energy-sensitive, electron-emissive surface 15 is formed in the processing chamber 10 prior to joining said processing chamber to the vacuum pump 19 and hybrid radiant energy sensor envelope 30. For forming the energy-sensitive, electron-emissive surface 15, the processing chamber 10 is connected to a vacuum pump 41 via a connecting tubulation 42 as shown in FIG. 3. The vacuum chamber 10 is evacuated by the vacuum pump 41 and baked out by means of temperature controlled oven 43 using standard high vacuum and vacuum tube procedures for cleaning and de-gassing the internal surfaces of the processing chamber 10. The energy-sensitive electron-emissive surfaces 15 are then formed on the surfaces of the transportable substrates 14 by reacting, at an elevated temperature, the alkali metals from the alkali generators 12 with another metal deposited upon the surfaces of the transportable substrates 14 from the metal evaporator 13. The activation of the alkali generator 12 and the metal evaporator 13 may be by means of resistive heating the said alkali generator and metal evaporator by passing an electric current through them from electric power sources 45, as shown in FIG. 3, or by RF induction heating methods. The recipes for the formation of the many possible types of energy-sensitive, electron-emissive surfaces 15 can be found in various textbooks and published articles and are not material to this disclosure. After the energy-sensitive electron-emissive surfaces 15 are formed, the processing chamber 10 is sealed and removed from the vacuum pump 41 and connecting tubulation 42, using conventional glass working techniques. The open end of the outer section of the transportation arm 16 is sealed to the vacuum pump 19, and hybrid radiant energy sensor envelope 30 by means of connection tubulation 18 as shown in FIG. 1.

After the processing chamber 10 is connected to the vacuum pump 19 and hybrid radiant energy sensor envelope 30, the vacuum pump 19 is activated and the hybrid radiant energy sensor envelope 30 is evacuated and baked out using standard vacuum tube processing techniques to de-gas all internal surfaces. The hammer 21 is then raised by the attractive force of magnet 22 and said hammer 21 is dropped on the sealed end 17 of the transport arm 16, breaking off sealed end 17 and opening up a vacuum passageway between the processing chamber 10 and the hybrid radiant energy sensor envelope 30. The magnetic attraction of magnet 22 acting on the magnetic susceptible band 38 of the transportable substrate 14 is then used to move the said transport substrate 14 from the processing chamber 10 to the hybrid radiant energy sensor envelope 30 through the transportation arm 16 and connecting tubulation 18. The transportable substrate 14 is then deposited on the support plate 34 and locked in place with the latch 35. A typical example of the latch 35 is shown in FIG. 4. The said latch consists of a catch 50 mounted on a spring 51 and a magnetic susceptible block 52 supported on a post 53. The spring 51 is mounted on the support plate 34 such that the catch 50 is held by spring tension inside the area intended to be occupied by the transportable substrate 14. Two fixed clips 54 are placed at two points diagonally opposite the catch 50 and define the location of the transportable substrate 14. Placing a magnet 22 against the wall of the vacuum enclosure 31 adjacent to the magnetically susceptible block 52 attracts said magnetically susceptible block, attracting catch 50 toward the wall of the vacuum enclosure 31, allowing the transportable substrate 14 to be placed between the fixed clips 54 and the catch 50. Removing the magnet 22 from the wall of the vacuum enclosure 31 allows the tension of spring 51 to return catch 50 against the transportable substrate 14, locking said substrate between the catch 50 and the two fixed clips 54. The described latch illustrates only one of many latch configurations which could be used to lock the transportable substrate 14 to the support plate 34 after said transportable substrate has been moved from the processing chamber 10 to the hybrid radiant energy sensor envelope 30.

After the transportable substrate 14 has been moved from the processing chamber 10 the hybrid radiant energy sensor envelope 30 is sealed and separated from the vacuum pump 19 and processing chamber 10 using conventional glass blowing or pinch-off techniques.

The illustrated method shows a singular hybrid radiant energy sensor envelope 30 connected to the processing chamber 10 and vacuum pump 19; however, the capability of forming energy-sensitive, electron-emissive surfaces 15 on a plurality of transportable substrates 14 in a single processing chamber 10 permits a plurality of hybrid radiant energy sensors up to the number of available transportable substrates to be connected to a single processing chamber 10. This allows the fabrication of a plurality of hybrid radiant energy sensor envelopes 30 from a single processing chamber 10 containing a plurality of transportable substrates 14.

This method also permits the processing and evaluation of the energy-sensitive electron-emissive surface 15 prior to committing the remainder of the hybrid radiant energy sensor envelope 30 to the final fabrication steps. This procedure assures that each of the said sensor envelopes 30 will have an acceptable energy-sensitive, electron-emissive surface 15 after fabrication, and reduces the nominal losses that occur as a result of these energy-sensitive surfaces 15 failing to obtain a minimum acceptable sensitivity.

The plurality of energy-sensitive electron-emissive surfaces 15 also permits selectivity between said energy-sensitive surfaces 15 for each hybrid radiant energy sensor envelope 30 and allows an energy-sensitive surface 15 with a high sensitivity to be mated with a hybrid radiant energy sensor envelope 30 having a low gain solid state element 33 and vice versa, so that the total sensitivities of all the fabricated hybrid radiant sensors 30 will be equalized. Likewise, an energy-sensitive surface 15 with a high sensitivity can be mated with a hybrid radiant sensor envelope 30 having a high gain solid state element 33 producing one or more sensors with superior performance.

What is claimed is:

1. A method for making a hybrid radiant energy sensor containing at least one solid state electron multiplying element which comprises:

forming an energy-sensitive electron-emissive surface on a transportable substrate in an evacuated processing chamber having a transport arm with a sealed internal passageway;

connecting the transport arm of the processing chamber containing the processed energy-sensitive electron-emissive surface to an evacuable hybrid radiant energy sensor envelope containing at least one solid state electron multiplying element;

evacuating and baking the hybrid radiant energy sensor envelope containing the solid state electron multiplying element;

breaking the seal in the internal passageway opening a vacuum passage between the processing chamber and the hybrid radiant energy sensor envelope;

transporting the transportable substrate with the energy-sensitive electron-emissive surface formed thereon through the vacuum passageway from the processing chamber to the hybrid radiant energy sensor and depositing the transportable substrate therein;

sealing the transportable substrate in the hybrid radiant energy sensor envelope.

2. A method for making a hybrid radiant energy sensor containing at least one solid state electron multiplying element as recited in claim 1 in which the step of transporting the transportable substrate from the processing chamber to the hybrid radiant energy sensor envelope is performed by attracting a magnetically susceptible transportable substrate with an energy-sensitive, electron-emissive surface formed thereon to an external source of magnetic flux and moving said source of magnetic flux with the magnetically susceptible substrate attracted thereto from the processing chamber to the hybrid radiant energy sensor envelope.

3. A method for making a hybrid radiant energy sensor containing at least one solid state electron multiplying element as recited in claim 1 in which the step of breaking the seal is performed by fracturing the seal in the internal passageway with a magnetically activated hammer.

4. A method for making a hybrid radiant energy sensor containing at least one solid state electron multiplying element, as recited in claim 1, further comprising latching the transportable substrate in the hybrid radiant energy sensor envelope, after the transportable substrate has been deposited therein.

5. A method for making a hybrid radiant energy sensor containing at least one solid state electron multiplying element as recited in claim 1 further comprising forming energy-sensitive electron-emissive surfaces on a plurality of transportable substrates within a single processing chamber, thereby permitting evaluation and selection of the most sensitive energy-sensitive electron-emissive surface for transport to the radiant energy sensor envelope..

6. A method for making a hybrid radiant energy sensor containing at least one solid state electron multiplying element as recited in claim 5 further comprising connecting the processing chamber containing a plurality of transportable substrates to a plurality of evacuable radiant energy sensor envelopes, thereby providing for the simultaneous fabrication of a plurality of hybrid radiant energy sensors.

* * * * *